(12) United States Patent
Nakatani et al.

(10) Patent No.: US 12,254,250 B2
(45) Date of Patent: Mar. 18, 2025

(54) MASK ESTIMATION DEVICE, MASK ESTIMATION METHOD, AND MASK ESTIMATION PROGRAM

(71) Applicant: NIPPON TELEGRAPH AND TELEPHONE CORPORATION, Tokyo (JP)

(72) Inventors: Tomohiro Nakatani, Musashino (JP); Marc Delcroix, Musashino (JP); Keisuke Kinoshita, Musashino (JP); Nobutaka Ito, Musashino (JP); Shoko Araki, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 684 days.

(21) Appl. No.: 17/270,448

(22) PCT Filed: Aug. 23, 2019

(86) PCT No.: PCT/JP2019/033184
§ 371 (c)(1),
(2) Date: Feb. 23, 2021

(87) PCT Pub. No.: WO2020/045313
PCT Pub. Date: Mar. 5, 2020

(65) Prior Publication Data
US 2021/0216687 A1 Jul. 15, 2021

(30) Foreign Application Priority Data

Aug. 31, 2018 (JP) .................................. 2018-163856

(51) Int. Cl.
*G06F 30/27* (2020.01)
*G06N 3/08* (2023.01)
*G10L 21/0216* (2013.01)

(52) U.S. Cl.
CPC .............. *G06F 30/27* (2020.01); *G06N 3/08* (2013.01); *G10L 21/0216* (2013.01)

(58) Field of Classification Search
CPC . G06F 30/27; G06N 3/08; G06N 7/01; G06N 3/044; G10L 21/0216;
(Continued)

(56) References Cited

U.S. PATENT DOCUMENTS 10,553,236 B1 * 2/2020 Ayrapetian ............. H04B 17/26
10,643,633 B2 * 5/2020 Nakatani ............. G10L 21/0232
(Continued)

OTHER PUBLICATIONS

Nakatani T, Ito N, Higuchi T, Araki S, Kinoshita K. Integrating DNN-based and spatial clustering-based mask estimation for robust MVDR beamforming. In2017 IEEE International Conference on Acoustics, Speech and Signal Processing (ICASSP) Mar. 5, 2017 (pp . 286-290). IEEE. (Year: 2017).*

(Continued)

*Primary Examiner* — Eunhee Kim
(74) *Attorney, Agent, or Firm* — XSENSUS LLP (57) ABSTRACT

A mask estimation apparatus includes processing circuitry configured to estimate, for a target segment to be processed among a plurality of segments of a continuous time, a first mask which is an occupancy ratio of a target signal to an observation signal of the target segment, based on a first feature obtained from a plurality of the observation signals of the target segment recorded at a plurality of locations, and estimate a parameter for modeling a second feature and a second mask which is an occupancy ratio of the target signal to the observation signal based on an estimation result of the first mask in the target segment and the second feature obtained from the plurality of the observation signals of the target segment.

5 Claims, 8 Drawing Sheets

(58) Field of Classification Search
CPC ....... G10L 2021/02166; G10L 21/0232; G10L 15/28; G10L 25/30; G10L 25/51
See application file for complete search history.

(56) References Cited

U.S. PATENT DOCUMENTS

| | | | | |
|---|---|---|---|---|
| 2008/0215651 | A1* | 9/2008 | Sawada | G10L 21/0272 708/205 |
| 2019/0267019 | A1* | 8/2019 | Ito | G06F 18/2134 |

OTHER PUBLICATIONS

Liu Y, Ganguly A, Kamath K, Kristjansson T. Neural network based time-frequency masking and steering vector estimation for two-channel MVDR beamforming. In2018 IEEE International Conference on Acoustics, Speech and Signal Processing (ICASSP) Apr. 15, 2018 (pp. 6717-6721). IEEE. (Year: 2018).*

Xiao X, Zhao S, Jones DL, Chng ES, Li H. On time-frequency mask estimation for MVDR beamforming with application in robust speech recognition. In2017 IEEE International Conference on Acoustics, Speech and Signal Processing (ICASSP) Mar. 5, 2017 (pp. 3246-3250). IEEE. (Year: 2017).*

Yu, Y., Wang, W. & Han, P. Localization based stereo speech source separation using probabilistic time-frequency masking and deep neural networks. J Audio Speech Music Proc. 2016, 7 (2016). (Year: 2016).*

Higuchi, Takuya, Nobutaka Ito, Takuya Yoshioka, and Tomohiro Nakatani. "Robust MVDR beamforming using time-frequency masks for online/offline ASR in noise." In 2016 IEEE International Conference on Acoustics, Speech and Signal Processing (ICASSP), pp. 5210-5214. IEEE, 2016. (Year: 2016).*

Higuchi T, Ito N, Yoshioka T, Nakatani T. Robust MVDR beamforming using time-frequency masks for online/offline ASR in noise. In2016 IEEE International Conference on Acoustics, Speech and Signal Processing (ICASSP) Mar. 20, 2016 (pp. 5210-5214). IEEE. (Year: 2016).*

Higuchi, T., Kinoshita, K., Ito, N., Karita, S. and Nakatani, T., Apr. 2018. Frame-by-frame closed-form update for mask-based adaptive MVDR beamforming. In 2018 IEEE International Conference on Acoustics, Speech and Signal Processing (ICASSP) (pp. 531-535). IEEE. (Year: 2018).*

Nakatani et al., "Integrating DNN-Based and Spatial Clustering-Based Mask Estimation for Robust MVDR Beamforming", IEEE, ICASSP, 2017, pp. 286-290.

* cited by examiner

|  | real data | simulated (simu) data |
|---|---|---|
| Training set | 1600 | 7138 |
| Development (dev) set | 1640 | 1640 |
| Evaluation (eval) set | 1320 | 1320 |

Fig. 7

| Sampling frequency | 16kHz |
|---|---|
| Frame length | 64ms |
| Frame overlap | 75% |
| Window function | Hanning |
| Number of EM iterations | 1 |
| Number of microphones | 6 |

Fig. 8

|  | dev | | | eval | | |
| --- | --- | --- | --- | --- | --- | --- |
|  | Ave | simu | real | Ave | simu | real |
| No frontend | 8.62 | 8.24 | 9.01 | 12.89 | 10.17 | 15.60 |
| LSTM | 5.33 | 5.33 | 5.33 | 8.14 | 6.59 | 9.69 |
| cACGMM | 5.60 | 5.98 | 5.21 | 9.20 | 8.86 | 9.53 |
| Proposed | 4.98 | 5.33 | 4.63 | 7.35 | 6.81 | 7.89 |

Fig. 9

|  | Set | Bus | Caf | Ped | Str | Ave |
| --- | --- | --- | --- | --- | --- | --- |
| LSTM |  | 6.34 | 5.32 | 4.69 | 4.96 | 5.33 |
| NoPrior | dev | 6.06 | 4.76 | 4.59 | 4.59 | 5.00 |
| PostTrained |  | 5.96 | 4.68 | 4.48 | 4.62 | 4.94 |
| LSTM |  | 13.48 | 9.81 | 8.00 | 7.45 | 9.69 |
| NoPrior | eval | 12.15 | 8.42 | 6.86 | 6.65 | 8.52 |
| PostTrained |  | 11.09 | 8.48 | 7.29 | 6.65 | 8.38 |

MASK ESTIMATION DEVICE, MASK ESTIMATION METHOD, AND MASK ESTIMATION PROGRAM

CROSS-REFERENCE TO RELATED APPLICATIONS

The present application is based on PCT filing PCT/JP2019/033184, filed Aug. 23, 2019, which claims priority to JP 2018-163856, filed Aug. 31, 2018, the entire contents of each are incorporated herein by reference.

TECHNICAL FIELD

The present disclosure relates to a mask estimation apparatus, a mask estimation method, and a mask estimation program.

BACKGROUND ART

Existing techniques for estimating a mask from the observation signal obtained by observing a sound are known, the mask being an occupancy ratio of a target signal to an observation signal. Here, the estimated mask is used for beam forming for noise cancellation in automatic speech recognition (ASR).

Non Patent Literature 1 discloses a technique for combining a mask estimation method using a neural network and a method of estimating a mask by spatial clustering with each other in order to accurately estimate a mask from observation signals recorded by a plurality of microphones.

CITATION LIST

Non Patent Literature

Non Patent Literature 1: Tomohiro Nakatani, Nobutaka Ito, Takuya Higuchi, Shoko Araki, and Keisuke Kinoshita, "INTEGRATING DNN-BASED AND SPATIAL CLUSTERING-BASED MASK ESTIMATION FOR ROBUST MVDR BEAMFORMING," Proc. IEEE ICASSP2017, pp. 286-290, 2017.

SUMMARY OF THE INVENTION

Technical Problem

The technique disclosed in Non Patent Literature 1 is a technique for reading all observation signals and then estimating a mask through batch processing. Here, application of automatic sound recognition based on a mask to a smart speaker or the like may require an online technique for sequentially estimating masks in accordance with an environment that changes every moment. However, in the technique disclosed in Non Patent Literature 1, the mask estimation cannot be performed online. In this manner, in the known techniques, there is a problem in that the mask estimation may not be accurately performed online.

Means for Solving the Problem

In order to solve the problems described above and achieve the object, a mask estimation apparatus includes: processing circuitry configured to: estimate, for a target segment to be processed among a plurality of segments of a continuous time, a first mask which is an occupancy ratio of a target signal to an observation signal of the target segment, based on a first feature obtained from a plurality of the observation signals of the target segment recorded at a plurality of locations, and estimate a parameter for modeling a second feature and a second mask which is an occupancy ratio of the target signal to the observation signal based on an estimation result of the first mask in the target segment and the second feature obtained from the plurality of the observation signals of the target segment.

Effects of the Invention

According to the present disclosure, mask estimation can be accurately performed online.

DESCRIPTION OF EMBODIMENTS

Hereinafter, embodiments of a mask estimation apparatus, a mask estimation method, and a mask estimation program according to the present application will be described in detail with reference to the drawings. Note that the present disclosure is not limited to the embodiments described below.

First Embodiment

Either observation signals recorded at a plurality of locations in a target segment among segments of a continuous time or feature extracted from the observation signals is input to a mask estimation apparatus of a first embodiment. Here, the observation signals include both target sound generated by a target sound source and background noise. In addition, the observation signals are recorded by microphones installed at a plurality of different locations.

A mask estimation apparatus 10 can estimate a mask for extracting a target signal from the observation signals. In this case, the mask is the probability that a signal of the target sound occupies the observation signal at each time frequency point. That is, the mask is the occupancy ratio of the signal of the target sound to the observation signal at each time frequency point. Similarly, the mask estimation apparatus 10 can estimate a mask for extracting a noise from the observation signal. In this case, the mask is the probability that a noise signal occupies the observation signal at each time frequency point. That is, the mask is the occupancy ratio of the noise signal to the observation signal at each time frequency point. Hereinafter, a signal of a target sound will be referred to as a target signal, and a signal of sound other than the target sound will be referred to as a noise signal. For example, the target sound is a sound uttered by a specific speaker.

Configuration of First Embodiment

Figure 1:
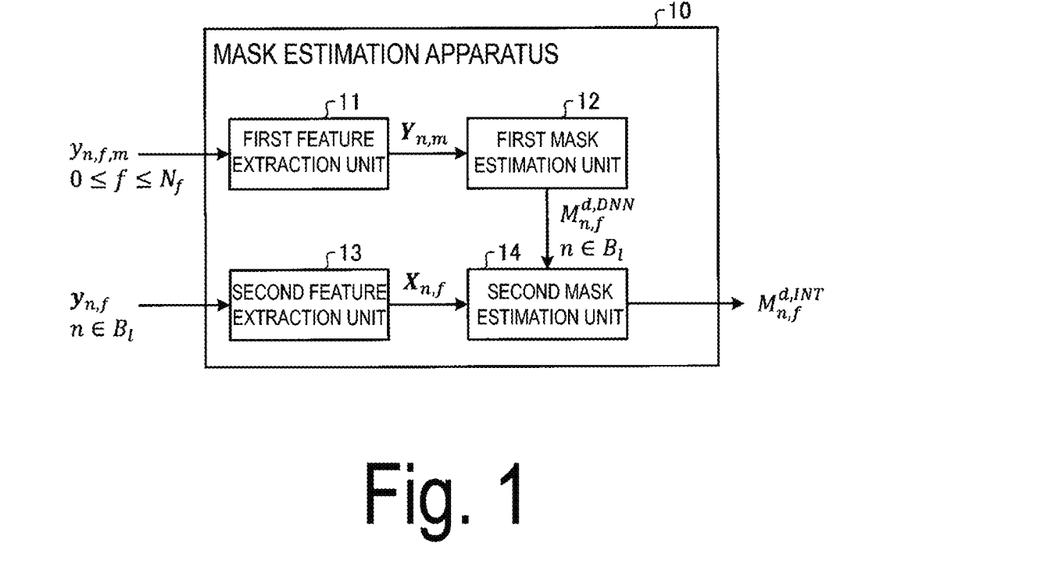
FIG. 1 is a diagram illustrating an example of a configuration of a mask estimation apparatus according to a first embodiment.

A configuration of the mask estimation apparatus according to the first embodiment will be described with reference to FIG. 1. FIG. 1 is a diagram illustrating an example of the configuration of the mask estimation apparatus according to the first embodiment. As illustrated in FIG. 1, the mask estimation apparatus 10 includes a first feature extraction unit 11, a first mask estimation unit 12, a second feature extraction unit 13, and a second mask estimation unit 14.

First, the mask estimation apparatus 10 receives inputs of observation signals in units of mini batches. Here, the mini batch is a unit of a predetermined time segment. For example, 0 ms to 500 ms can be configured as a first mini batch after the recording of an observation signal is started, 500 ms to 750 ms may be configured as a second mini batch, and a mini batch can be thereafter configured every 250 ms. In addition, the length of each mini batch may be fixed or may vary. Hereinafter, $B_l$ represents a first mini batch. That is, a partial section obtained by dividing all observation signals every predetermined time is referred to as a mini batch.

The mask estimation apparatus 10 converts observation signals that are input in units of mini batches into frequency domain signals for each short-time frame on the basis of short-time frequency analysis. Note that the converted observation signal may be input to the mask estimation apparatus 10. Hereinafter, as an example, description will be given on the assumption that a short-time Fourier transform (STFT) is used for such conversion. It is assumed that $y_{n, f, m}$ represents a STFT of an observation signal. Here, n and f are indexes of a time and a frequency. In addition, m is an index representing a microphone for recording an observation signal. Additionally, it is assumed that $1 \le n \le N_f$, $0 \le f \le N_f$, and $1 \le m \le N_m$ hold.

The first feature extraction unit 11 extracts spectral features $Y_{n, m}$ from STFT $y_{n, f, m}$ which is an observation signal. Specifically, as shown in Equation (1), the first feature extraction unit 11 extracts, as a spectral feature, a vector $Y_{n, m}$ having a logarithm of $y_{n, f, m}$ as an element.

[Math. 1]

$$Y_{n,f,m} = \log|y_{n,f,m}| \quad (1)$$

[Math. 2]

$$Y_{n,m} = [Y_{n,0,m}, \ldots, Y_{n,N_f,m}] \quad (2)$$

The first mask estimation unit 12 estimates a first mask on the basis of spectral features obtained from observation signals of target segments recorded at one or a plurality of locations. Here, the target segment is a mini batch corresponding to an observation signal which is input to the mask estimation apparatus 10. In addition, a spectral feature is an example of the first feature.

Specifically, the first mask estimation unit 12 estimates the first mask using a neural network. The first mask estimation unit 12 inputs the spectral feature $Y_{n, m}$ extracted by the first feature extraction unit 11 into a neural network and obtains masks $M_{n, f}^{d, DNN}$ on the basis of only observation signals recorded by an m-th microphone as an output of the neural network.

In addition, the first mask estimation unit 12 can estimate a mask on the basis of observation signals recorded by each of the plurality of microphones, obtain estimated values of the plurality of masks, and then combine the estimated values of the plurality of masks to obtain an estimated value of one mask. A mask combination method includes a method of, such as taking an average value or taking a median value (median) among estimated values.

In short, it is only required that the first mask estimation unit 12 estimates a first mask, which is the occupancy ratio of target signal to an observation signal of a target segment on the basis of a first feature obtained from observation signals of target segments recorded at a plurality of locations, and the first mask estimation unit 12 may use some of the observation signals of the target segments (for example, observation signals for the m-th microphone) or may use all of the observation signals (observation signals for M microphones) for the calculation of the first mask.

In the first mask estimation unit 12, a neural network capable of online processing spectral features that are input sequentially is used. For example, in the first mask estimation unit 12, a long short-term memory (LSTM) network is used. Furthermore, it is assumed that parameters of a neural network have been learned using a simulation sound or the like including either a target sound or a noise or both a target sound and a noise.

Here, d takes 0 or 1. In addition, the first mask estimation unit 12 can obtain two types of masks, $M_{n, f}^{0, DNN}$ and $M_{n, f}^{1, DNN}$. $M_{n, f}^{0, DNN}$ is a mask that extracts a noise signal from an observation signal at a time frequency point (n, f). On the other hand, $M_{n, f}^{1, DNN}$ is a mask that extracts a target signal from an observation signal at a time frequency point (n, f). $M_{n, f}^{d, DNN}$ is a numerical value ranging from 0 to 1.

In addition, when a relationship such as $M_{n, f}^{0, DNN} + M_{n, f}^{1, DNN} = 1$ is predetermined, the first mask estimation unit 12 can output any one mask from a neural network, and the other mask can be calculated by subtracting the output mask from 1. For this reason, the first mask estimation unit 12 may output both $M_{n, f}^{0, DNN}$ and $M_{n, f}^{1, DNN}$ from the neural network or may output one of them.

The second feature extraction unit 13 extracts a spatial feature $X_{n, f}$ from a vector $y_{n, f}$ as shown in Equation (4). That is, the second feature extraction unit 13 extracts the spatial feature $X_{n, f}$ from an observation signal of a target segment. In addition, as shown in Equation (3), elements of the vector $y_{n, f}$ are a STFT of observation signals for each microphone. Here, $\|.\|$ represents the Euclidean norm. In addition, T represents a non-conjugated transposition.

[Math. 3]

$$y_{n,f} = [y_{n,f,1}, \ldots, y_{n,f,N_m}]^T \quad (3)$$

[Math. 4]

$$X_{n,f} = \frac{y_{n,f}}{\|y_{n,f}\|} \quad (4)$$

The second mask estimation unit 14 estimates a second mask which is the occupancy ratio of a target signal to a spatial parameter, obtained by modeling a spatial feature of a target segment, and an observation signal on the basis of estimation results of the first mask in the target segment and a spatial feature obtained from an observation signal of the target segment. Here, the spatial feature is an example of a second feature.

Specifically, the second mask estimation unit 14 estimates, for each target segment, a second mask on the basis of the first mask and a distribution model of a spatial feature with spatial parameters as conditions. In this case, the second mask estimation unit 14 uses a complex angular central Gaussian mixture model (cACGMM) as the distribution model of the spatial feature. In addition, cACGMM is defined as shown in Equation (5).

[Math. 5]

$$\mathcal{A}(X|d_{n,f}=d;\theta^{SC}) = \frac{(N_m-1)!}{2\pi^{(N_m)} det R_f^d} \frac{1}{\left(X^H (R_f^d)^{-1} X\right)^{N_m}} \quad (5)$$

Here, a parameter set $\theta^{SC}$ is represented as $\{\{w_d^f\},\{R_d^f\}\}$. In addition, $w_d^f$ is a mixed weight and is a prior probability of $d_{n,f}$. That is, it is written as $w_d^f = p(d_{n,f}=d)$. Note that, as will be described later, in the present embodiment, $w_d^f$ is equivalent to the first mask and is replaced with the estimated value thereof. In addition, Equation (5) represents a conditional distribution of a spatial feature X defined by a complex angular central Gaussian (cACG) distribution when d is given. In this case, a spatial parameter, $R_d^f$ is a parameter defining the shape of the complex angular central Gaussian distribution and corresponds to a positive value Hermite matrix in an $N_m \times N_m$ dimension. Here, det represents a determinant. In addition, H represents a conjugated transposition.

Figure 2:
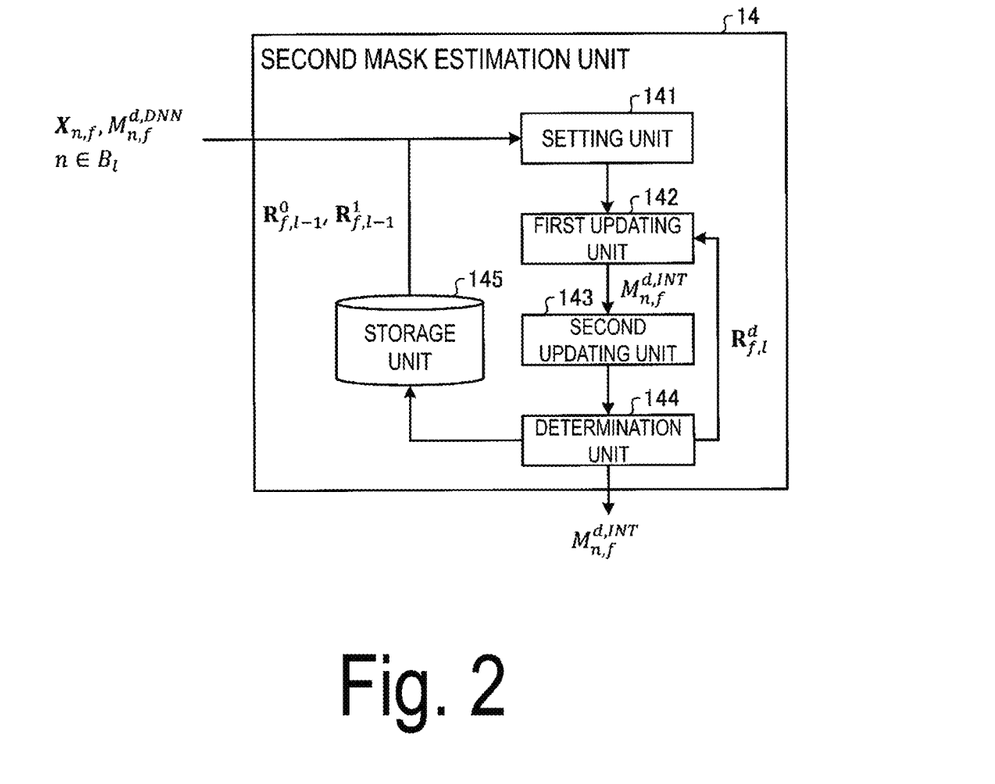
FIG. 2 is a diagram illustrating an example of a configuration of a second mask estimation unit according to the first embodiment.

The second mask estimation unit 14 estimates a second mask by an expectation-maximization (EM) algorithm using the complex angular central Gaussian mixture model described above. FIG. 2 is a diagram illustrating an example of a configuration of the second mask estimation unit according to the first embodiment. As illustrated in FIG. 2, the second mask estimation unit 14 includes a setting unit 141, a first updating unit 142, a second updating unit 143, a determination unit 144, and a storage unit 145. Note that, the storage unit 145 is installed inside the second mask estimation unit 14 in FIG. 2, but it is needless to say that the storage unit 145 may be installed outside the second mask estimation unit 14, that is, as a storage unit inside the mask estimation apparatus 10.

The setting unit 141 configures a first mask estimated for a target segment and spatial parameters in one segment prior to the target segment as initial values of a second mask and spatial parameters in the target segment. Specifically, the setting unit 141 configures an initial value of a second mask $M_{n,f}^{d,INT}$ as shown in Equation (6). Note that the second mask estimation unit 14 acquires a first mask $M_{n,f}^{d,DNN}$ from the first mask estimation unit 12. In addition, when a mini batch corresponding to the target segment is configured to be $B_l$, the setting unit 141 configures an initial value of a spatial parameter $R_{f,l}^d$ as shown in Equation (7). In addition, the setting unit 141 configures a cumulative sum $\Lambda_{f,l-1}^d$ of the first masks, as shown in Equation (8).

[Math. 6]

$$M_{n,f}^{d,INT} = M_{n,f}^{d,DNN} \quad (6)$$

[Math. 7]

$$R_{f,l}^d = R_{f,l-1}^d \quad (7)$$

[Math. 8]

$$\Lambda_{f,l}^d = \Lambda_{f,l-1}^d + \sum_{n \in B_l} M_{n,f}^{d,DNN} \quad (8)$$

The first updating unit 142 updates a spatial parameter on the basis of a cumulative sum of first masks up to the target segment, and a spatial feature and a second mask of the target segment. Specifically, the first updating unit 142 updates the spatial parameters $R_{f,l}^d$ as shown in Equation (9). In this case, the first updating unit 142 calculates an updated spatial parameter $R_{f,new}^d$ as shown in Equation (10).

[Math. 9]

$$R_{f,l}^d = \frac{\Lambda_{f,l-1}^d}{\Lambda_{f,l}^d} R_{f,l-1}^d + \frac{1}{\Lambda_{f,l}^d} R_{f,new}^d \quad (9)$$

[Math. 10]

$$R_{f,new}^d = N_m \sum_{n \in B_l} \frac{M_{n,f}^{d,INT} X_{n,f} X_{n,f}^H}{X_{n,f}^H (R_{f,l}^d)^{-1} X_{n,f}} \quad (10)$$

The second updating unit 143 updates a second mask on the basis of a spatial feature, a first mask, and a spatial parameter of a target segment. Specifically, the second updating unit 143 updates a second mask $M_{n,f}^{d,INT}$ as shown in Equation (11).

[Math. 11]

$$M_{n,f}^{d,INT} = \frac{M_{n,f}^{d,DNN} \mathcal{A}(X_{n,f}|d;\theta^{SC})}{\sum_d M_{n,f}^{d,DNN} \mathcal{A}(X_{n,f}|d;\theta^{SC})} \quad (11)$$

In a case where a second mask is updated by the second updating unit 143, the determination unit 144 determines whether or not a predetermined convergence condition has been satisfied, and in a case that the determination unit 144 determines that the convergence condition has not been satisfied, the determination unit 144 further causes the first updating unit 142 and the second updating unit 143 to perform processing. That is, the first updating unit 142 and the second updating unit 143 repeat processing until the predetermined convergence condition is satisfied. In this case, the second mask and the spatial parameter are updated each time the processing is repeated, and the accuracy of extraction of a target sound of the second mask is improved.

Further, the convergence condition of the determination unit 144 may be a condition of whether the number of repetitions exceeds a threshold value. In this case, the threshold value of the number of repetitions can be configured to one. That is, the first updating unit 142 and the second updating unit 143 may perform updating processing on one mini batch only once. In addition, a condition for the determination unit 144 to determine convergence may be a condition of whether the amount of update of a second mask and the amount of update of a spatial parameter in one updating operation are equal to or less than a fixed value.

In addition, the determination unit 144 may determine that convergence has been achieved in a case where the amount of update of a value of a likelihood function $L(\theta^{SC})$ represented by Equation (12) is equal to or less than a fixed value. Xi is a set of spatial features $X_{n,f}$ observed up to a mini batch $B_l$. $Y_l$ is a set of spatial parameters $Y_{n,m}$ observed up to the mini batch $B_l$. In addition, $\theta^{DNN}$ is a parameter of a neural network of the first mask estimation unit 12.

[Math. 12]

$$\mathcal{L}(\theta^{SC}) = p(\mathcal{X}_l, \mathcal{Y}_l; \theta^{DNN}, \theta^{SC}) \quad (12)$$

Additionally, Equation (12) can be replaced with Equation (13). In this case, $p(d_{n,f}=d|y_l;\theta^{DNN})$ on the right side in Equation (13) can be considered to be equivalent to a first mask $M_{n,f}^{d,DNN}$ estimated by the first mask estimation unit 12. Thus, in the present embodiment, $p(d_{n,f}=d|y_l;\theta^{DNN})$ is replaced with $M_{n,f}^{d,DNN}$ to maximize a likelihood function. For this reason, the second mask estimation unit 14 can maximize a likelihood function $L(\theta^{SC})$ for each mini batch using a method similar to the method disclosed in Non Patent Literature 1 and can estimate a second mask $M_{n,f}^{d,INT}$ and a parameter $\theta^{SC}$. Furthermore, the storage unit stores a spatial parameter estimated in each of mini batches, and the spatial parameter is used as an initial value of a spatial parameter in the next mini batch, so that it is possible to perform mask estimation with a high level of accuracy, as compared to a case where likelihood functions are individually maximized for each mini batch.

[Math. 13]

$$\mathcal{L}(\theta^{SC}) = \prod_{n,f} \sum_d p(X_{n,f}|d_{n,f}=d; \theta^{SC}) p(d_{n,f}=d|\mathcal{Y}_l; \theta^{DNN}) \quad (13)$$

The storage unit 145 stores a value which is calculated in the previous segment and used in the initial setting of a target segment. That is, the storage unit 145 stores a spatial parameter $R_{f,l-1}^d$ calculated in a mini batch $B_{l-1}$ and a cumulative sum of first masks $\Lambda_{f,l-1}^d$. Then, when the setting unit 141 sets the spatial parameter $R_{f,l-1}^d$ and the cumulative sum of the first masks $\Lambda_{f,l-1}^d$ in the mini batch $B_l$, the setting unit 141 acquires the spatial parameter $R_{f,l-1}^d$ and the cumulative sum of the first masks $\Lambda_{f,l-1}^d$ from the storage unit 145.

Note that, in a case where a mini batch is a first mini batch, that is, when l=1, the spatial parameter $R_{f,l-1}^d$ is not calculated. In this case, like the method disclosed in Non Patent Literature 1, the setting unit 141 may configure a value learned using predetermined learning data for an initial value $R_{f,0}^d$ of the spatial parameter. For example, learning data of a spatial parameter $R_{f,0}^1$ of a target signal is an observation signal obtained when a particular speaker speaks in an environment having no noise. In addition, the setting unit 141 may configure a unit matrix for the initial value $R_{f,0}^1$ of the spatial parameter. Furthermore, a spatial parameter $R_{f,0}^0$ of a noise signal may be estimated from an observation signal including only noise.

Processing in First Embodiment

Figure 3:
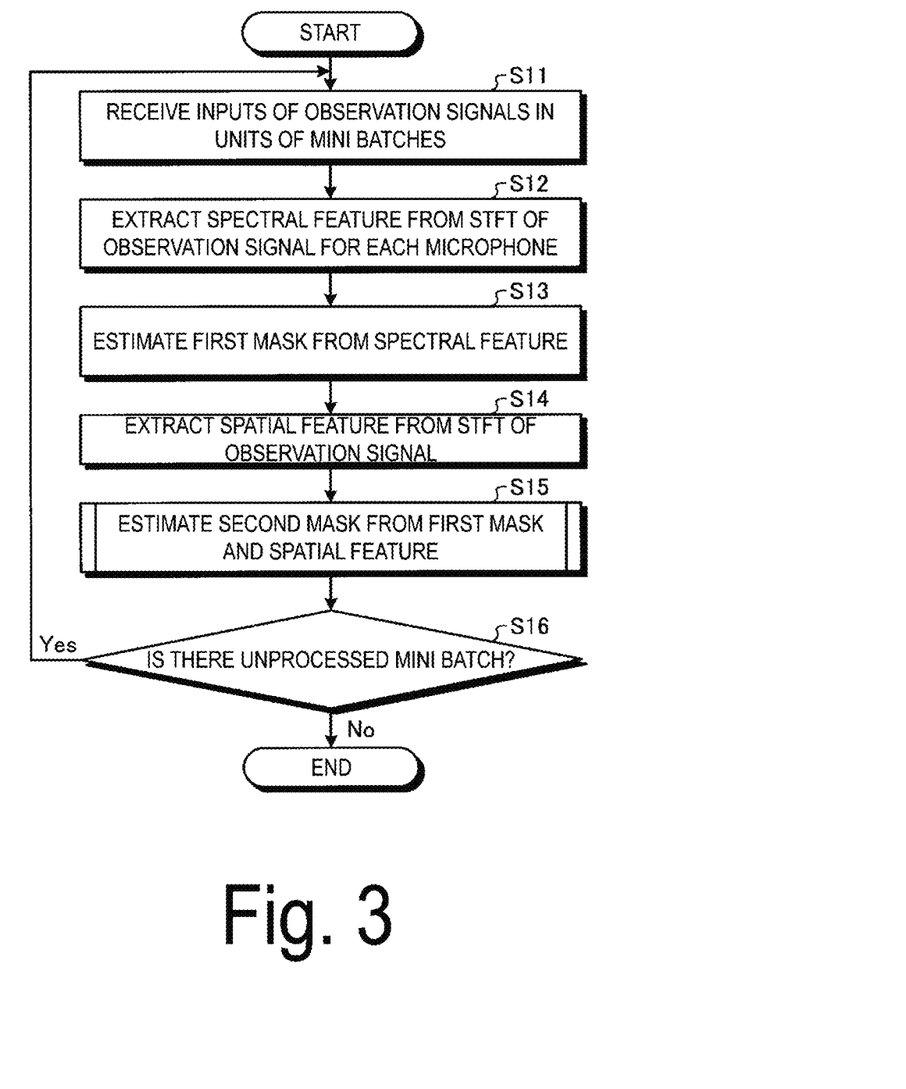
FIG. 3 is a flowchart illustrating a flow of process performed by the mask estimation apparatus according to the first embodiment.

A flow of process performed by the mask estimation apparatus 10 of the present embodiment will be described with reference to FIG. 3. FIG. 3 is a flowchart illustrating the flow of the process performed by the mask estimation apparatus according to the first embodiment.

As illustrated in FIG. 3, first, the mask estimation apparatus 10 receives inputs of observation signals in units of mini batches (step S11). Here, the mask estimation apparatus 10 may calculate STFT of an observation signal. Furthermore, the observation signal to be input to the mask estimation apparatus 10 may be a signal on which STFT has been performed.

Next, the mask estimation apparatus 10 extracts a spectral feature from the STFT of the observation signal for each microphone (step S12). Then, the mask estimation apparatus 10 estimates a first mask from the spectral feature (step S13). In this case, the mask estimation apparatus 10 can estimate the first mask using a neural network.

Furthermore, the mask estimation apparatus 10 extracts a spatial feature from the STFT of the observation signal (step S14). Then, the mask estimation apparatus 10 estimates a second mask from the first mask and the spatial feature (step S15).

Here, the mask estimation apparatus 10 determines whether or not there is an unprocessed mini batch (step S16). In a case where there is an unprocessed mini batch (step S16, Yes), the process returns to step S11 and the mask estimation apparatus 10 receives an input of an observation signal of the next mini batch. On the other hand, in a case where there is no unprocessed mini batch (step S16, No), the mask estimation apparatus 10 terminates the process.

Figure 4:
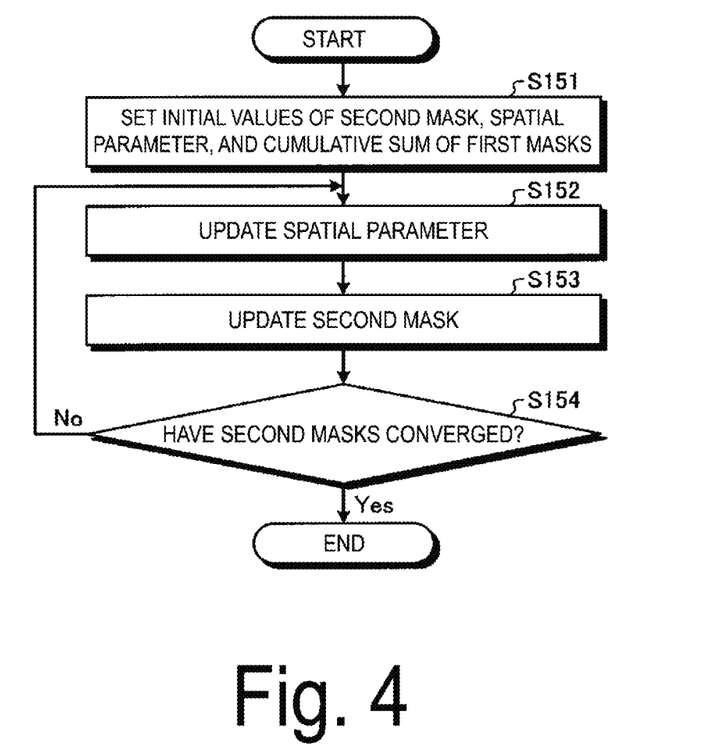
FIG. 4 is a flowchart illustrating a flow of process performed by the mask estimation apparatus according to the first embodiment.

A process in which the mask estimation apparatus 10 estimates a second mask (step S15 in FIG. 3) will be described in detail using FIG. 4. FIG. 4 is a flowchart illustrating a flow of process performed by the mask estimation apparatus according to the first embodiment.

As illustrated in FIG. 4, first, the mask estimation apparatus 10 configures initial values of a second mask, a spatial parameter, and a cumulative sum of first masks (step S151). Next, the mask estimation apparatus 10 updates the spatial parameter using the cumulative sum of the first masks, the spatial feature, and the second mask (step S152). Then, the mask estimation apparatus 10 updates the second mask on the basis of the spatial feature, the first mask, and the spatial parameter (step S153).

Here, the mask estimation apparatus 10 determines whether or not the second masks have converged (step S154). In a case where the mask estimation apparatus 10 determines that the second masks have not converged (step S154, No), the process returns to step S152 and the mask estimation apparatus 10 updates the spatial parameter. On the other hand, in a case where the mask estimation apparatus 10 determines that the second masks have converged (Yes in step S154), the mask estimation apparatus 10 terminates the processing.

Effects of First Embodiment

As described so far, the first mask estimation unit 12 estimates a first mask, which is the occupancy ratio of a target signal to an observation signal of a target segment on the basis of a first feature obtained from observation signals of target segments recorded at a plurality of locations, for a segment to be processed among segments of a continuous time as a target segment. In addition, the second mask estimation unit 14 estimates a parameter for modeling a second feature and a second mask, which is the occupancy ratio of a target signal to an observation signal, on the basis of estimation results of a first mask in a target segment and a second feature obtained from an observation signal of the target segment. In this manner, the mask estimation apparatus 10 can estimate a final mask with a high level of accuracy by combining two mask estimation methods with each other. Furthermore, the mask estimation apparatus 10 can sequentially estimate masks with respect to an observation signal for each target segment. For this reason, according to the first embodiment, it is possible to estimate a mask online with a high level of accuracy.

Additionally, the mask estimation apparatus 10 combines a technique using a neural network for inputting a spectral feature and a technique using a distribution model with each other. For this reason, for example, even when there is a mismatch between parameters of a neural network that has been learned in advance and observation signals, the accuracy of a mask can be improved using a spatial parameter. Furthermore, even when there is a frequency band having a significantly low signal to noise ratio, mask estimation can be performed with a high level of accuracy by taking into account a frequency pattern of a target signal on the basis of a spectral feature.

Second Embodiment

In a second embodiment, a mask estimation apparatus 10 estimates a second mask by substituting an estimated value of a first mask for an estimated value of the second mask from a first mini batch to a predetermined mini batch and by using a calculated value of a spatial parameter in the subsequent mini batches.

Here, as the amount of observation signals including a target signal increases, the accuracy of a spatial parameter with respect to the target signal is improved. In contrast, when the amount of observation signals including a target signal is small, the accuracy of a spatial parameter with respect to a calculated target signal is low, which may be impractical. That is, when a spatial parameter for a target signal calculated in a mini batch where the number of observation signals including a target signal is small is used for estimation performed by the second mask estimation unit 14, the accuracy of estimation of a second mask in a target segment estimated as a result may also be lower. Consequently, in the second embodiment, the mask estimation apparatus 10 estimates a second mask by substituting a first mask for an estimated value of the second mask until observation signals including a sufficient amount of target signals are used to calculate a spatial parameter and by using a calculated value (estimated value) of the spatial parameter after the observation signals including a sufficient amount of target signals are used to the spatial parameter.

Configuration of Second Embodiment

Figure 5:
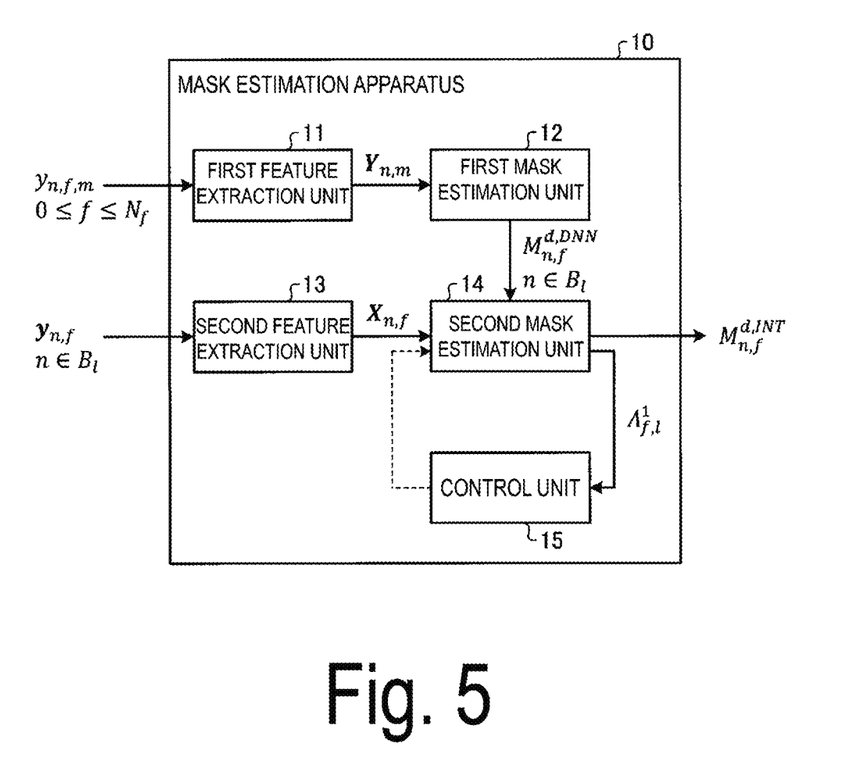
FIG. 5 is a diagram illustrating an example of a configuration of a mask estimation apparatus according to a second embodiment.

As illustrated in FIG. 5, in the second embodiment, the mask estimation apparatus 10 further includes a control unit 15 in addition to the same processing unit as that in the first embodiment. FIG. 5 is a diagram illustrating an example of a configuration of the mask estimation apparatus according to the second embodiment.

The control unit 15 determines whether or not the amount of target signals included in an observation signal up to a target segment which is a segment for which mask estimation is to be performed exceeds a predetermined threshold. Here, in a case where the amount of target signals exceeds the threshold value, like the first embodiment, the control unit 15 performs control so that the second mask estimation unit 14 estimates a second mask using a calculated value of a spatial parameter. On the other hand, in a case where the amount of target signals does not exceed the threshold value, the control unit 15 performs control so that the second mask estimation unit 14 substitutes an estimated value of a first mask for an estimated value of a second mask. Thereby, in the second embodiment, the mask estimation apparatus 10 can estimate a second mask with a high level of accuracy even in a case where an appropriate initial value of a spatial parameter is not given.

The control unit 15 determines whether or not the amount of target signals included in an observation signal of the past segment including a target segment exceeds a threshold value, on the basis of a predetermined estimated value. For example, the control unit 15 determines whether or not a cumulative sum $\Lambda_{f,1}^{1}$ of first masks for a target signal exceeds a threshold value. Here, $\Lambda_{f,1}^{1}$ becomes larger as the number of frames including a target signal increases.

A target to be determined by the control unit 15 is not limited to $\Lambda_{f,1}^{1}$. For example, as the number of processed mini batches increases, the number of observation signals including a target signal increases (at least does not decrease), and thus the control unit 15 may perform determination in accordance with the number of processed mini batches. Additionally, the control unit 15 may perform determination using the length of a sound interval detected on the basis of the detection of a sound interval for determining whether or not a sound is included in an observation signal.

Process in Second Embodiment

Figure 6:
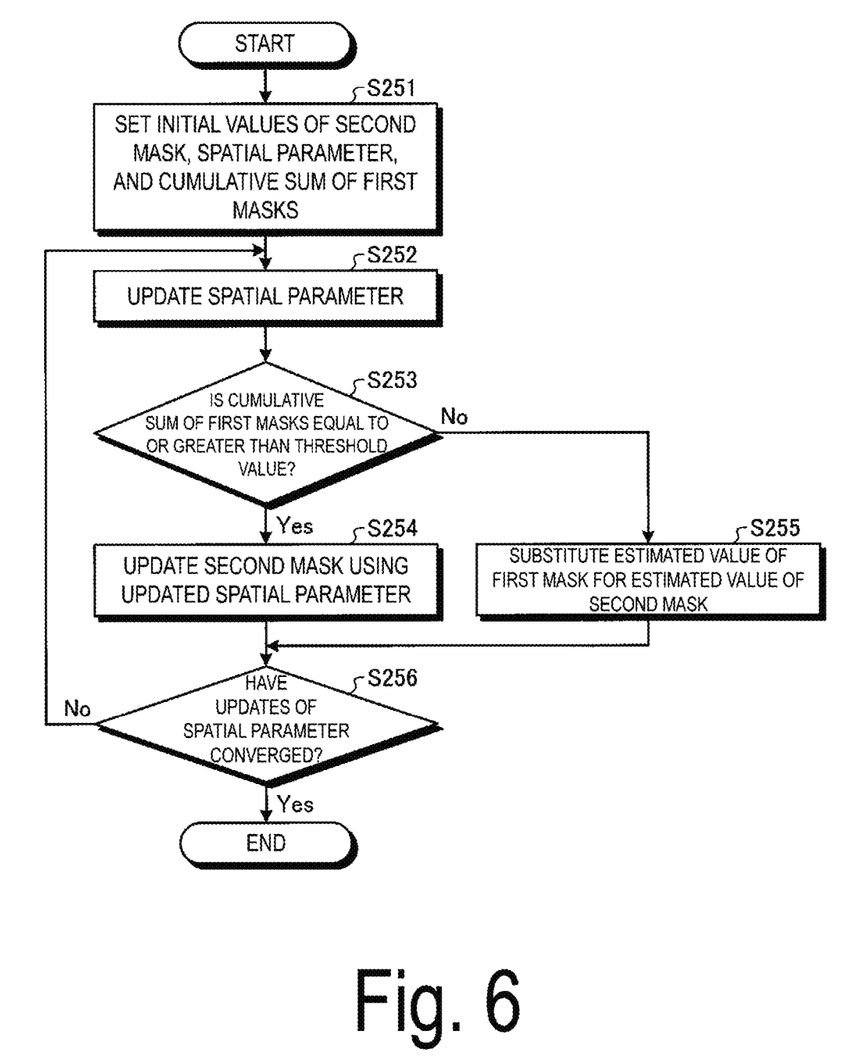
FIG. 6 is a flowchart illustrating a flow of processing of the mask estimation apparatus according to the second embodiment.

A process in which the mask estimation apparatus 10 estimates a second mask will be described in detail using FIG. 6. FIG. 6 is a flowchart illustrating a flow of process performed by the mask estimation apparatus according to the second embodiment. Like the process in FIG. 4, the process in FIG. 6 corresponds to step S15 in FIG. 3. For this reason, the process in FIG. 6 is performed on observation signals in units of mini batches input in step S11 in FIG. 3.

As illustrated in FIG. 6, first, the mask estimation apparatus 10 configures initial values of a second mask, a spatial parameter, and a cumulative sum of first masks in mini batches (step S251). Next, the mask estimation apparatus 10 updates the spatial parameter using the cumulative sum of the first masks, a spatial feature, and the second mask (step S252).

Here, the mask estimation apparatus 10 determines whether or not the cumulative sum of the first masks is equal to or greater than a threshold value (step S253). In a case where the cumulative sum of the first masks is equal to or greater than the threshold value (step S253, Yes), the mask estimation apparatus 10 updates the second mask using the spatial parameter updated in step S252 (step S254). On the other hand, in a case where the cumulative sum of the first masks is not equal to or greater than the threshold value (step S253, No), the mask estimation apparatus 10 substitutes an estimated value of the first mask for an estimated value of the second mask (step S255).

Here, the mask estimation apparatus 10 determines whether or not the updates of the spatial parameter have converged (step S256). In a case where the mask estimation apparatus 10 determines that the updates of the spatial parameter have not converged (No in step S256), the process returns to step S252 and the mask estimation apparatus 10 updates the spatial parameter. On the other hand, in a case where the mask estimation apparatus 10 determines that the updates of the spatial parameter have converged (Yes in step S256), the mask estimation apparatus 10 terminates the processing.

Here, the mask estimation apparatus 10 updates the spatial parameter in step S252 even in a case where the cumulative sum of the first masks is not equal to or greater than the threshold value (step S253, No). This is because, even when the cumulative sum of the first mask is equal to or less than the threshold value, a spatial parameter with respect to a target signal is updated, so that it is possible to increase the accuracy of estimation of the spatial parameter with respect to the target signal at a point of time when the cumulative sum of the first masks exceeds the threshold value.

Experimental Results

Figure 7:
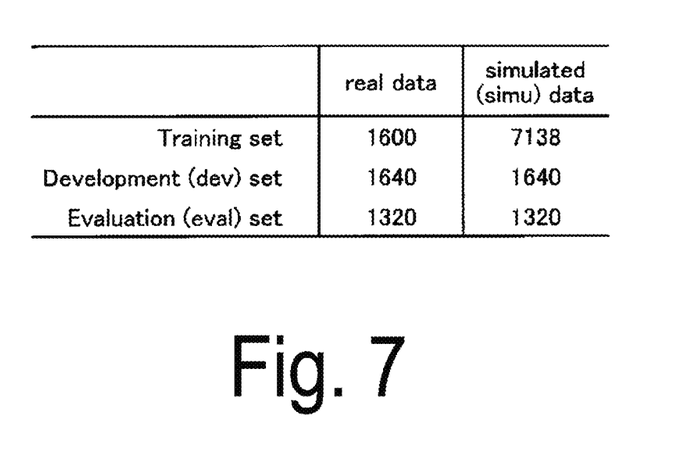
FIG. 7 is a diagram illustrating sound data used in an experiment.

Here, experiments performed to compare existing techniques and the embodiments with each other will be described. Sound data for sound recognition of CHiME-3 was used for the experiment. The sound data is sound obtained by reading a newspaper under a plurality of noise environments and recorded by a tablet including a plurality of microphones. In addition, as illustrated in FIG. 7, sound data includes a plurality of subsets. Further, each of the subsets includes data actually recorded (real data) and data generated by a simulation (simu data). FIG. 7 illustrates the number of utterances in each data. FIG. 7 is a diagram illustrating sound data used in the experiment.

Further, in the experiment, sound recognition was performed by estimating a mask by a plurality of techniques including the existing techniques and the techniques according to the embodiments and extracting an objective sound using the estimated mask. The existing techniques include a mask estimation technique (LSTM) based on DNN and a mask estimation technique (cACGMM) based on spatial clustering.

Figure 8:
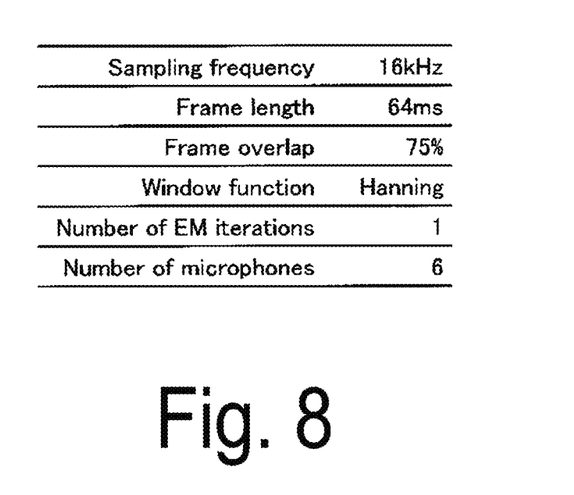
FIG. 8 is a diagram illustrating hyper parameters in an experiment.

An initial value of a spatial parameter was learned in advance. In addition, the length of a first mini batch was set to 500 ms, and the lengths of a second mini batch and the subsequent mini batches were set to 250 ms. The setting of other hyper parameters are as illustrated in FIG. 8. FIG. 8 is a diagram illustrating hyper parameters in the experiment.

As illustrated in FIG. 8, the value of Number of EM iterations is 1. This indicates that the mask estimation apparatus 10 updates a spatial parameter and a second mask only once when estimating a second mask for each mini batch.

Figure 9:
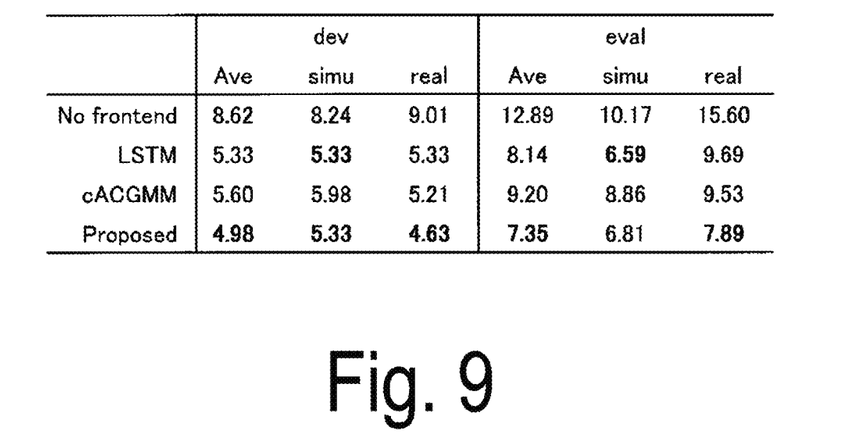
FIG. 9 is a diagram illustrating results of an experiment.

FIG. 9 illustrates a word error rate (WER) when a mask is estimated by each technique and sound recognition is performed. FIG. 9 is a diagram illustrating experiment results. As illustrated in FIG. 9, most of the word error rates in a case where the mask was estimated by the technique according to the embodiment (Proposed) were lower than those in the existing techniques. Thereby, it can be said that a mask estimation technique according to the embodiment has an effect of improving the accuracy of sound recognition as compared to the existing techniques.

Figure 10:
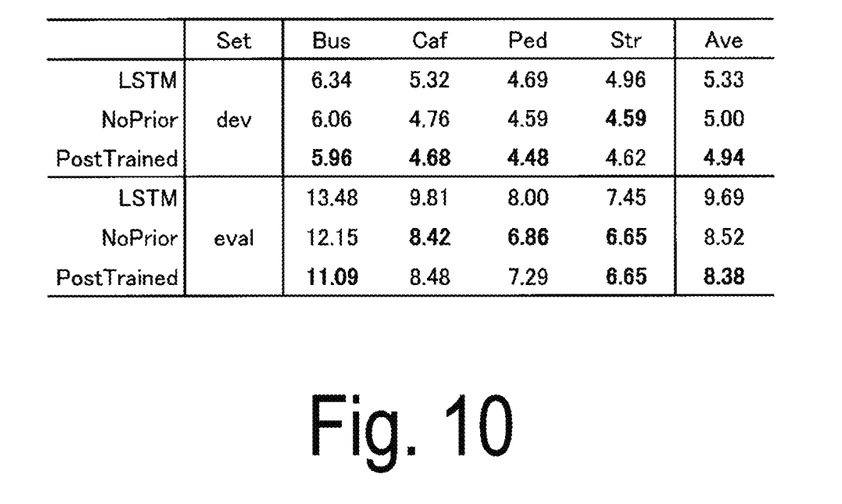
FIG. 10 is a diagram illustrating results of an experiment.

Furthermore, results obtained by performing the same experiment by changing a method of configuring a spatial parameter when a second mask is estimated are illustrated in FIG. 10. FIG. 10 is a diagram illustrating experiment results. Note that Bus, Caf, Ped, and Str represent the above-described plurality of noise environments.

NoPrior in FIG. 10 is a technique for configuring a unit matrix as an initial value of a spatial parameter in the first embodiment. Additionally, PostTrained is a technique according to the second embodiment, that is, a technique for controlling, by the control unit 15, whether to substitute an estimated value of a first mask for an estimated value of a second mask. Note that, in PostTrained, the control unit 15 performs determination using a cumulative sum of first masks and a threshold value is configured to 1.5. As illustrated in FIG. 10, word error rates of NoPrior and Post-Trained were lower than those of the existing technique. Both NoPrior and PostTrained are techniques that do not require preliminary learning of a spatial parameter. Thereby, it can be said that the mask estimation technique according to the embodiment can improve the accuracy of sound recognition without performing preliminary learning, compared with the existing technique.

System Configuration and the Like

Further, components of the apparatuses illustrated in the drawings are functional and conceptual components and do not necessarily need to be physically configured as illustrated in the drawings. That is, a specific form of distribution and integration of the respective apparatuses is not limited to forms illustrated in the drawings, and all or some of the apparatuses can be distributed or integrated functionally or physically in any units according to various loads, use situations, and the like. Further, all or some of processing functions performed by each apparatus may be implemented by a central processing unit (CPU) and a program analyzed and executed by the CPU, or may be implemented as hardware by wired logic.

In addition, all or some of the processes described as being performed automatically among the processes described in the present embodiment can be performed manually, or all or some of the processes described as being performed manually can be performed automatically by a known method. In addition, information including the processing procedures, the control procedures, the specific names, and various data and parameters described in the above-described document and drawings can be optionally changed unless otherwise specified.

Program

As one embodiment, the mask estimation apparatus 10 can be implemented by installing a mask estimation program for executing the above-described mask estimation process as packaged software or online software on a desired computer. For example, an information processing apparatus can be configured to function as the mask estimation apparatus 10 by causing the information processing apparatus to execute the mask estimation program described above. Here, the information processing apparatus includes a desktop or laptop personal computer. In addition, as the information processing apparatus, a mobile communication terminal such as a smartphone, a mobile phone, and a personal handyphone system (PHS), or a smart terminal such as personal digital assistant (PDA) are included in the category.

Further, the mask estimation apparatus 10 can be implemented as a learning server apparatus that provides to a client services regarding the above-described mask estimation process, the client being a terminal apparatus to be used by a user. For example, the mask estimation server apparatus may be implemented as a server apparatus that provides a mask estimation service in which an observation signal is input and a second mask is output. In this case, the mask estimation server apparatus may be implemented as a web server or may be implemented as a cloud that provides services regarding the above-described mask estimation process through outsourcing.

Figure 11:
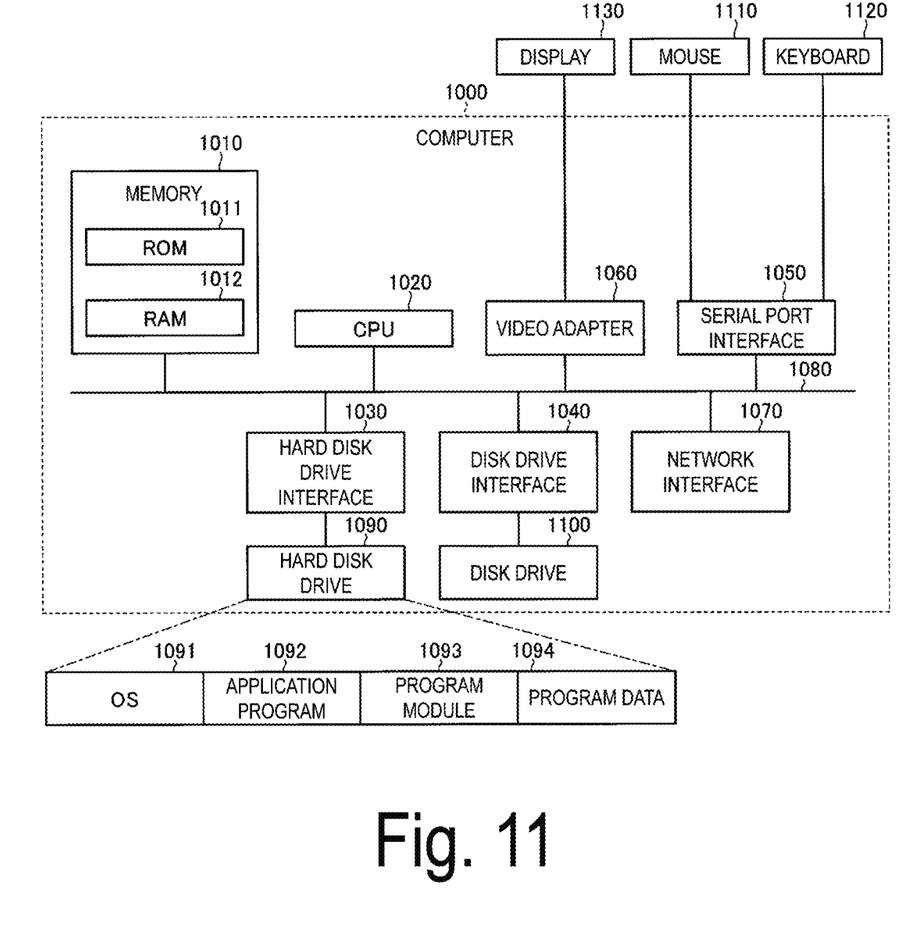
FIG. 11 is a diagram illustrating an example of a computer for executing a mask estimation program.

FIG. 11 is a diagram illustrating an example of a computer executing a mask estimation program. A computer 1000 includes, for example, a memory 1010 and a CPU 1020. In addition, the computer 1000 includes a hard disk drive interface 1030, a disk drive interface 1040, a serial port interface 1050, a video adapter 1060, and a network interface 1070. These units are connected to each other by a bus 1080.

The memory 1010 includes a read only memory (ROM) 1011 and a random access memory (RAM) 1012. The ROM 1011 stores a boot program, such as a basic input output system (BIOS). The hard disk drive interface 1030 is connected to a hard disk drive 1090. The disk drive interface 1040 is connected to a disk drive 1100. A detachable storage medium such as a magnetic disk or an optical disc is inserted into the disk drive 1100. The serial port interface 1050 is connected to, for example, a mouse 1110 and a keyboard 1120. The video adapter 1060 is connected to, for example, a display 1130.

Here, the hard disk drive 1090 stores, for example, an OS 1091, an application program 1092, a program module 1093, and program data 1094. That is, a program defining each of the processes of the mask estimation apparatus 10 is implemented as the program module 1093 in which computer-executable code has been written. The program module 1093 is stored in, for example, the hard disk drive 1090. For example, the program module 1093 for executing the same processing as the functional configuration in the mask estimation apparatus 10 is stored in the hard disk drive 1090. Note that the hard disk drive 1090 may be replaced by an SSD.

Setting data used in the processing of the embodiments described above is stored as the program data 1094, for example, in the memory 1010 or the hard disk drive 1090. The CPU 1020 reads the program module 1093 and the program data 1094 stored in the memory 1010 and the hard disk drive 1090 into the RAM 1012 as necessary, and executes the processing of the above-described embodiments.

Note that the program module 1093 and the program data 1094 are not limited to being stored in the hard disk drive 1090, and may be stored, for example, in a removable storage medium, and read by the CPU 1020 via the disk drive 1100 or its equivalent. Alternatively, the program module 1093 and the program data 1094 may be stored in other computers connected via a network (a Local Area Network (LAN), and a Wide Area Network (WAN)). In addition, the program module 1093 and the program data 1094 may be read by the CPU 1020 from another computer through the network interface 1070.

REFERENCE SIGNS LIST

10 Mask estimation apparatus
11 First feature extraction unit
12 First mask estimation unit
13 Second feature extraction unit
14 Second mask estimation unit
15 Control unit
141 Setting unit
142 First updating unit
143 Second updating unit
144 Determination unit
145 Storage unit

The invention claimed is:

1. A mask estimation apparatus comprising:
processing circuitry configured to sequentially perform for a plurality of segments of continuous time:
online estimation, for a target segment to be processed among the plurality of segments of continuous time, of a first mask which is an occupancy ratio of a target signal to an observation signal of the target segment, based on a first feature obtained from a plurality of the observation signals of the target segment recorded at a plurality of locations, the occupancy ratio indicating a probability of a target sound occupying each time frequency point of the observation signal; and
online estimation of a parameter for modeling a second feature and a second mask which is an occupancy ratio of the target signal to the observation signal based on an estimation result of the first mask in the target segment and the second feature obtained from the plurality of the observation signals of the target segment, wherein the processing circuitry is further configured to:
update the parameter based on a cumulative sum of a plurality of first masks up to the target segment, and the second feature of the target segment and the second mask,
update the second mask based on the second feature of the target segment, the first mask, and the parameter, and
repeatedly perform the update of the parameter and the second mask until a predetermined convergence condition is satisfied,
wherein the cumulative sum of the plurality of the first masks indicates an amount of target signals included in the observation signal up to the target segment which is a segment for which mask estimation is to be performed,
the cumulative sum of the plurality of first masks indicates a cumulative sum of the probability that a signal of the target sound occupies the observation signal, and
the processing circuitry is further configured to determine whether the cumulative sum of the probability up to the time of the target segment exceeds a predetermined threshold value.

2. The mask estimation apparatus according to claim 1, wherein the processing circuitry is further configured to:
estimate the first mask using a neural network, and
estimate the second mask based on the first mask and a distribution model of the second feature with the parameter as a condition.

3. The mask estimation apparatus according to claim 1, wherein the processing circuitry is further configured to:
estimate the second mask based on the estimated parameter in a case where the amount of the plurality of the target signals exceeds the threshold value, and
substitute the estimation result of the first mask for an estimated value of the second mask in a case where the amount of the plurality of the target signals does not exceed the threshold value.

4. A mask estimation method comprising:
sequentially performing for a plurality of segments of continuous time:
online estimation, for a target segment to be processed among the plurality of segments of continuous time, of a first mask which is an occupancy ratio of a target signal to an observation signal of the target segment, based on a first feature obtained from a plurality of the observation signals of the target segment recorded at a plurality of locations, the occupancy ratio indicating a probability of a target sound occupying each time frequency point of the observation signal; and
online estimation of a parameter for modeling a second feature and a second mask which is an occupancy ratio of the target signal to the observation signal based on an estimation result of the first mask in the target segment and the second feature obtained from the plurality of the observation signals of the target segment, by processing circuitry, wherein the method further comprises:

updating the parameter based on a cumulative sum of a plurality of first masks up to the target segment, and the second feature of the target segment and the second mask, updating the second mask based on the second feature of the target segment, the first mask, and the parameter, and repeatedly performing the update of the parameter and the second mask until a predetermined convergence condition is satisfied, wherein the cumulative sum of the plurality of the first masks indicates an amount of target signals included in the observation signal up to the target segment which is a segment for which mask estimation is to be performed, the cumulative sum of the plurality of first masks indicates a cumulative sum of the probability that a signal of the target sound occupies the observation signal, and the method further includes determining whether the cumulative sum of the probability up to the time of the target segment exceeds a predetermined threshold value.

5. A non-transitory computer-readable recording medium storing therein a mask estimation program that causes a computer to execute a process comprising:

sequentially performing for a plurality of segments of continuous time:

online estimation, for a target segment to be processed among the plurality of segments of continuous time, of a first mask which is an occupancy ratio of a target signal to an observation signal of the target segment, based on a first feature obtained from a plurality of the observation signals of the target segment recorded at a plurality of locations, the occupancy ratio indicating a probability of a target sound occupying each time frequency point of the observation signal; and online estimation of a parameter for modeling a second feature and a second mask which is an occupancy ratio of the target signal to the observation signal based on an estimation result of the first mask in the target segment and the second feature obtained from the plurality of the observation signals of the target segment, wherein the process further comprises:

updating the parameter based on a cumulative sum of a plurality of first masks up to the target segment, and the second feature of the target segment and the second mask, updating the second mask based on the second feature of the target segment, the first mask, and the parameter, and repeatedly performing the update of the parameter and the second mask until a predetermined convergence condition is satisfied, wherein the cumulative sum of the plurality of the first masks indicates an amount of target signals included in the observation signal up to the target segment which is a segment for which mask estimation is to be performed, the cumulative sum of the plurality of first masks indicates a cumulative sum of the probability that a signal of the target sound occupies the observation signal, and the process further includes determining whether the cumulative sum of the probability up to the time of the target segment exceeds a predetermined threshold value.

* * * * *